United States Patent
Wang et al.

(10) Patent No.: US 10,962,820 B2
(45) Date of Patent: Mar. 30, 2021

(54) DISPLAY SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Dawei Wang, Beijing (CN); Jiaqiang Wang, Beijing (CN); Rui Liu, Beijing (CN); Jian Ren, Beijing (CN); Jingfei Mu, Beijing (CN); Yanchao Zhang, Beijing (CN); Yanming Wang, Beijing (CN); Hailing Jin, Beijing (CN); Xiujun Cai, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 114 days.

(21) Appl. No.: 16/342,166

(22) PCT Filed: Jul. 19, 2018

(86) PCT No.: PCT/CN2018/096251
§ 371 (c)(1),
(2) Date: Apr. 15, 2019

(87) PCT Pub. No.: WO2019/024687
PCT Pub. Date: Feb. 7, 2019

(65) Prior Publication Data
US 2019/0235307 A1   Aug. 1, 2019

(30) Foreign Application Priority Data

Aug. 1, 2017 (CN) .......................... 201710650560.5

(51) Int. Cl.
*G02F 1/1335* (2006.01)
*H01L 27/12* (2006.01)
*G02F 1/1362* (2006.01)

(52) U.S. Cl.
CPC .. *G02F 1/133512* (2013.01); *G02F 1/136209* (2013.01); *H01L 27/1248* (2013.01)

(58) Field of Classification Search
None
See application file for complete search history.

(56) References Cited

U.S. PATENT DOCUMENTS

2009/0309813 A1   12/2009  Fujita
2010/0214195 A1*   8/2010  Ogasawara ....... G02F 1/136286
                                                          345/55

(Continued)

FOREIGN PATENT DOCUMENTS

CN         101849255 A       9/2010
CN         101887189 A      11/2010

(Continued)

OTHER PUBLICATIONS

PCT International Search Report, Application No. PCT/CN2018/096251, dated Sep. 25, 2018, 5 pages: with English translation.

(Continued)

*Primary Examiner* — Phu Vu
(74) *Attorney, Agent, or Firm* — Armstrong Teasdale LLP (57) ABSTRACT

The embodiments of the present disclosure provide a display substrate and a display device, which relate to the field of display technologies, to solve the problem that a sawtoothed display effect occurs at an edge of an AA area when displaying if the edge of the AA area is non-linear. The display substrate includes a black matrix. The display substrate is provided with a display area, and at least a part of an edge of the display area has an irregular edge having a (Continued)

concave-convex shape. The display area has a plurality of subpixels arranged in a matrix form, and has a vision weakening area close to the irregular edge. In the vision weakening area, the black matrix includes a light shielding block located in the subpixel.

13 Claims, 6 Drawing Sheets

(56) References Cited

U.S. PATENT DOCUMENTS

| | | | |
|---|---|---|---|
| 2016/0131938 A1* | 5/2016 | Ji | G02F 1/133512 349/42 |
| 2018/0149932 A1* | 5/2018 | Nakamura | G02F 1/133512 |
| 2019/0228724 A1* | 7/2019 | Shima | G09G 3/3677 |

FOREIGN PATENT DOCUMENTS

| | | |
|---|---|---|
| CN | 105206213 A | 12/2015 |
| CN | 105511152 A | 4/2016 |
| CN | 105629596 A | 6/2016 |
| CN | 105788470 A | 7/2016 |
| CN | 105911744 A | 8/2016 |
| CN | 107255883 A | 10/2017 |
| JP | 2008216356 A | 9/2008 |

OTHER PUBLICATIONS

PCT Written Opinion, Application No. PCT/CN2018/096251, dated Sep. 25, 2018, 6 pages.: with English translation of relevant part.
China First Office Action, Application No. 201710650560.5, dated Aug. 12, 2019, 24 pps.: with English translation.

* cited by examiner

DISPLAY SUBSTRATE AND DISPLAY DEVICE

CROSS REFERENCE TO RELATED APPLICATIONS

This patent application is a National Stage Entry of PCT/CN2018/096251 filed on Jul. 19, 2018, which claims the benefit and priority of Chinese patent application No. 201710650560.5 filed on Aug. 1, 2017, the disclosures of which are incorporated by reference herein in their entirety as part of the present application.

BACKGROUND

The present disclosure relates to the field of display technologies, and particularly to a display substrate and a display device.

With continuous development of display technologies, user's requirements of the appearance or the integration performance of the display substrate are becoming higher and higher. In order to meet the needs of the users, an edge of an Active Area (AA area for short) of a display substrate may be non-linear. In this way, the AA area can meet requirements of diversified edge shapes of the display substrate. In addition, it is possible to integrate some other components, such as an earpiece or a camera, into a recess at the edge of the AA area.

BRIEF DESCRIPTION

The embodiments of the present disclosure provide a display substrate and a display device.

An aspect of the embodiments of the present disclosure provides a display substrate including a black matrix, the display substrate is provided with a display area, and at least a part of an edge of the display area is an irregular edge having a concave-convex shape; in the display area, the black matrix includes a plurality of light shielding bars crossed to define a plurality of subpixels arranged in a matrix form, the display area has a vision weakening area close to the irregular edge, and in the vision weakening area, the black matrix further includes a light shielding block located in the subpixel and the light shielding block occupies a part of area of the subpixel.

According to the embodiments of the present disclosure, the vision weakening area includes a plurality of weakening sub-areas close to the irregular edge, in a same weakening sub-area, an area of the light shielding block in each of the subpixels is equal, in an arrangement direction of the weakening sub-areas toward the irregular edge, an area of the light shielding block in the weakening sub-areas gradually increases.

According to the embodiments of the present disclosure, in the arrangement direction of the weakening sub-areas toward the irregular edge, absolute values of differences between the areas of the light shielding blocks in adjacent two of the weakening sub-areas are equal.

According to the embodiments of the present disclosure, a plurality of subpixels adjacent to each other and having different light emitting colors constitute one pixel unit, and each of the subpixels in a same pixel unit is located in a same weakening sub-area.

According to the embodiments of the present disclosure, a shape of the light shielding block is rectangular, and in each of the subpixels, the light shielding block is disposed close to the irregular edge.

According to the embodiments of the present disclosure, a shape of the light shielding block is non-rectangular, and in each of the subpixels, an area of the light shielding block gradually increases in a direction toward the irregular edge.

According to the embodiments of the present disclosure, a shape of the light shielding block is a right-angled triangle, and a bottom edge or a right-angled edge of the right-angled triangle is close to the irregular edge.

According to the embodiments of the present disclosure, a shape of the light shielding block is a right-angled trapezoid, and a bottom edge or a right-angled edge of the right-angled trapezoid is close to the irregular edge.

According to the embodiments of the present disclosure, the display area has an irregular edge in left-right symmetry, and the light shielding block located in a left half of the display area and the light shielding block located in a right half of the display area are symmetrical to each other in shape.

According to the embodiments of the present disclosure, the display area has an irregular edge in upper-lower symmetry, and the light shielding block located in an upper half of the display area and the light shielding block located in a lower half of the display area are symmetrical to each other in shape.

According to the embodiments of the present disclosure, each of the weakening sub-areas includes N rows and/or N columns of the subpixels, wherein $N \geq 1$, and N is a positive integer.

According to the embodiments of the present disclosure, the display substrate further includes a substrate and a color filter layer located thereon, and the black matrix is disposed on a side of the color filter layer away from the substrate.

According to the embodiments of the present disclosure, the display substrate further includes a substrate and a TFT array structure disposed between the substrate and the black matrix, wherein the TFT array structure is located in the display area of the display substrate.

Another aspect of the embodiments of the present disclosure provide a display device, including any one of the aforementioned display substrates.

According to the embodiments of the present disclosure, the display substrates further includes a non-display area located around the display area; the display device further includes a component to be integrated, and an orthographic projection of the component to be integrated on the display substrate is located in a recessed portion of the irregular edge of the display area.

BRIEF DESCRIPTION OF THE DRAWINGS

In order to more clearly describe the technical solutions in the embodiments of the present disclosure or in the prior art, the drawings to be used in the description of the embodiments or the prior art will be briefly introduced as follows. Obviously, the drawings in the following description just illustrate some embodiments of the present disclosure, and persons skilled in the art can obtain other drawings from them without paying a creative effort.

DETAILED DESCRIPTION

The technical solutions in the embodiments of the present disclosure will be clearly and completely described as follows with reference to the drawings for the embodiments of the present disclosure. Obviously, those described are just a part rather than all of the embodiments of the present disclosure. Based on the embodiments of the present disclosure, any other embodiments obtained by persons skilled in the art without paying a creative effort should fall within the protection scope of the present disclosure.

Figure 1:
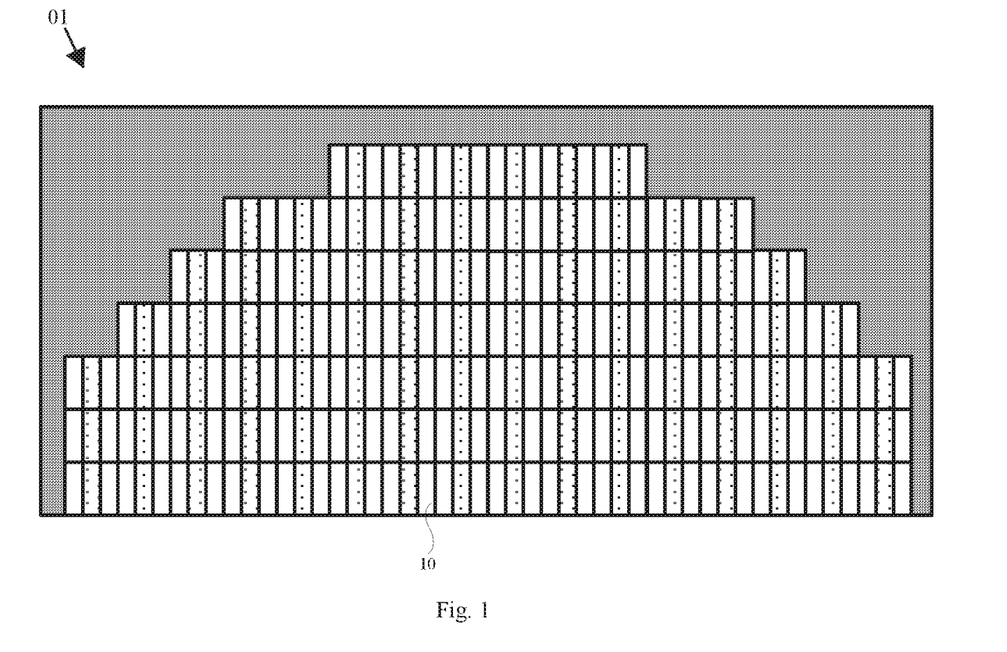
FIG. 1 illustrates a schematic diagram of a structure of a display substrate having an AA area with irregular edges.

As illustrated in FIG. 1, a display substrate 01 has rectangular subpixels 10 in an AA area. In that case, in order that an edge of the AA area has a non-linear shape, a number of the subpixels 10 may be increased or decreased at the edge of the AA area, so that the edge of the AA area is curved macroscopically. As illustrated in FIG. 1, the edge of the AA area of the display substrate 01 is semi-arced macroscopically.

However, although being curved macroscopically, the edge of the AA area is saw-toothed microcosmically due to the uneven arrangement of the rectangular subpixels 10 at the edge of the AA area. Therefore, when displaying, the edge of the AA area will have a saw-toothed vision effect, which is not benefit to improve the display effect.

Figure 2:
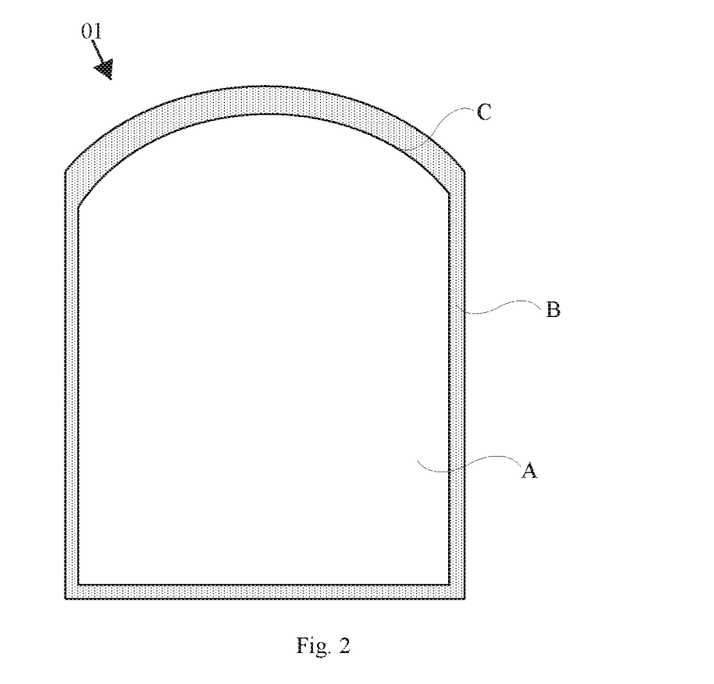
FIG. 2 illustrates a schematic diagram of a structure of a display substrate having an AA area with irregular edges according to an embodiment of the present disclosure.
Figure 3:
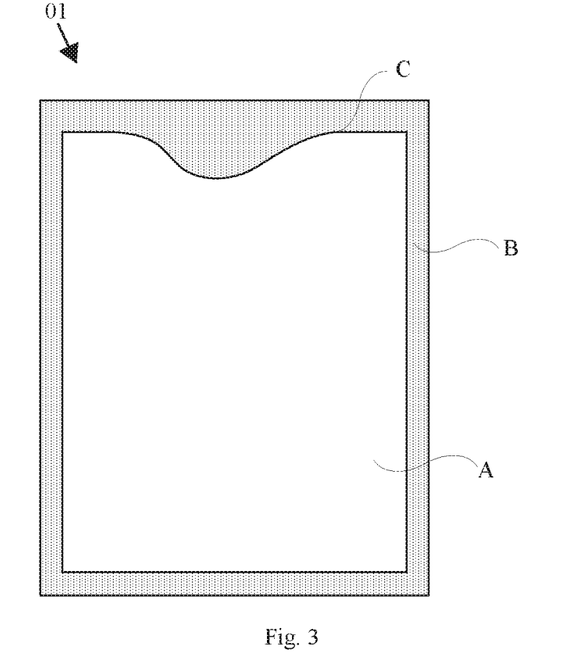
FIG. 3 illustrates a schematic diagram of a structure of a display substrate having an AA area with irregular edges according to another embodiment of the present disclosure.

An embodiment of the present disclosure provides a display substrate 01. As illustrated in FIG. 2 or FIG. 3, the display substrate 01 is provided with a display area A and a non-display area B located around the display area A, wherein at least a part of an edge of the display area A has an irregular edge C having a concave-convex shape, i.e., the irregular edge is non-linear.

Specifically, FIG. 2 illustrates an example in which an irregular edge C is arc-shaped. In that case, one edge of the non-display region B located on the same side as the irregular edge C of the display region A may also be made in an arc shape, so that the entire display substrate 01 may have an arc-shaped edge to meet the users' requirements of diversified shapes of the display device. Alternatively, FIG. 3 illustrates an example in which an irregular edge C is curve-shaped. A part of the curve is recessed, so that other component to be integrated, such as an earpiece, a camera, or the like, can be integrated at the recessed position. In this way, the AA area can surround a part of the component to be integrated, thereby reducing an area of the non-display area B occupied by the component to be integrated, and promoting the design of the narrow frame and the wide screen.

Figure 4:
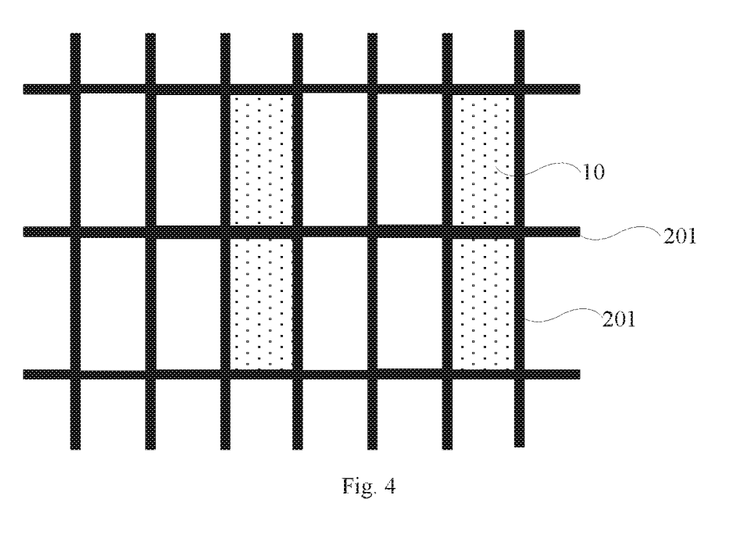
FIG. 4 illustrates a schematic diagram of a structure of a light shielding bar in a display area according to an embodiment of the present disclosure.
Figure 5:
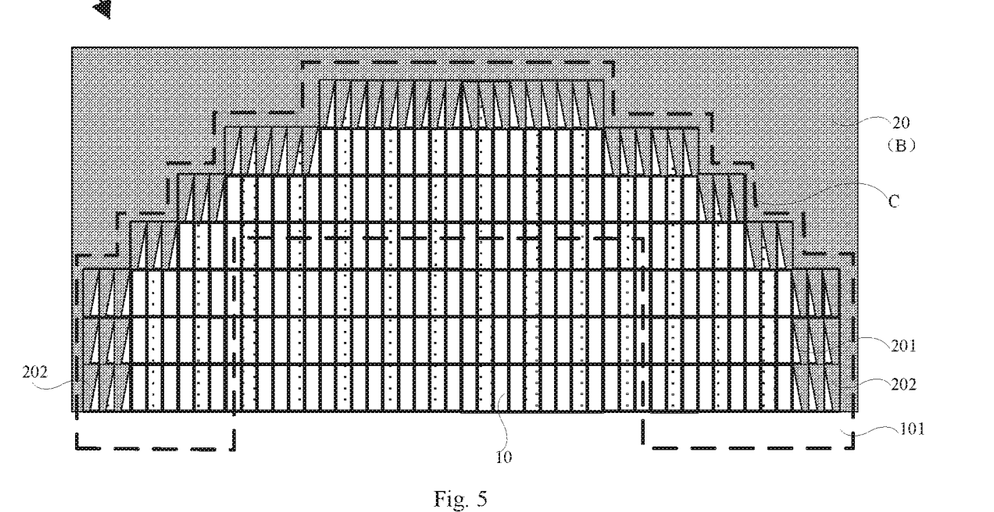
FIG. 5 illustrates a schematic diagram of a structure of a vision weakening area close to irregular edges of an AA area according to an embodiment of the present disclosure.

On this basis, as illustrated in FIG. 5, the display substrate 01 may further include a black matrix 20 (BM) located in the display area A and the non-display area B, wherein in the display area A, the black matrix 20 may include a plurality of light shielding bars 201 crossed as illustrated in FIG. 4. The crossed light shielding bars 201 define a plurality of subpixels 10 arranged in a matrix form.

On this basis, as illustrated in FIG. 5, the display area A has a vision weakening area 101 (indicated by the dashed lines in FIG. 5) close to the irregular edge C. In the vision weakening area 101, the black matrix 20 further includes a light shielding block 202 located in the subpixel 10. The light shielding block 202 occupies a part of area of the subpixel 10, which reduces the light transmission area of the subpixel 10 in the vision weakening area 101.

In which, the light shielding block 202 and the light shielding bar 201 may be made of a same material and into an integral structure. In that case, the black matrix 20 having the light shielding block 202 and the light shielding bar 201 can be formed by the masking, exposing, and etching processes at one step.

It should be noted that FIG. 5 only illustrates parts of the irregular edge C and the vision weakening area 101. Moreover, the present disclosure does not limit the number of the subpixels 10 in the vision weakening area 101, as long as it can be ensured that the vision weakening area 101 includes at least one row and/or one column of subpixels 10 close to the irregular edge C. On the premise of not affecting the display effect of the middle portion of the display area A, persons skilled in the art can set the number of the subpixels 10 in the vision weakening area 101 as required.

In addition, in order to form the irregular edge C in the AA area, as illustrated in FIG. 5, a part of the subpixels 10 in the AA area close to the edge may be arranged unevenly.

Figure 6:
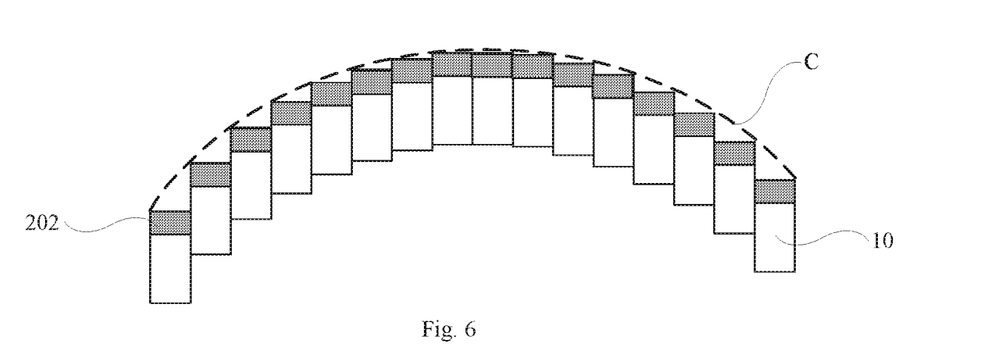
FIG. 6 illustrates a schematic diagram of a structure of a light shielding block according to an embodiment of the present disclosure.

On this basis, the shape of the light shielding block 202 may be rectangular as illustrated in FIG. 6. In that case, in each of the subpixels 10, the light shielding block 202 may be disposed close to the irregular edge C. In this way, a part of the subpixel 10 shielded by the light shielding block 202 may be close to the irregular edge C, so as to reduce the brightness of the irregular edge C and its periphery, thereby reducing the sensitive to human eyes in capturing the shape of the irregular edge C.

Alternatively, the shape of the light shielding block 202 may be non-rectangular. For example, the shape of the light shielding block 202 may be trapezoidal, triangular, or the like. In that case, in order to reduce the brightness of the irregular edge C and its periphery, the area of the light shielding block 202 in each of the subpixels 10 gradually increases in a direction toward the irregular edge C.

Figure 7:
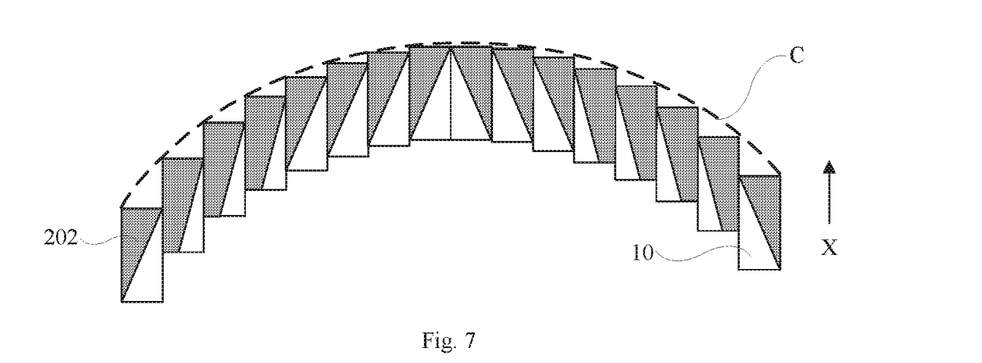
FIG. 7 illustrates a schematic diagram of a structure of a light shielding block according to another embodiment of the present disclosure.

On this basis, as illustrated in FIG. 7, when the shape of the light shielding block 202 is a right-angled triangle, a bottom edge or a right-angled edge of the right-angled triangle is close to the irregular edge C, so that the area of the light shielding block 202 gradually increases in the direction toward the irregular edge C.

Alternatively, when the shape of the light shielding block 202 is a right-angled trapezoid, a bottom edge or a right-angled edge of the right-angled trapezoid is close to the irregular edge C, so that the area of the light shielding block 202 gradually increases in the direction toward the irregular edge C.

For a light shielding block 202 shaped as a right-angled trapezoid or a right-angled triangle, bottom edge and right-angled edge of the right angle may overlap with a position of a light shielding bar 201 around a subpixel 10 where the light shielding block 202 is located. The light shielding bar 201 and the light shielding block 202 may be of an integral structure. In this way, it is beneficial to calculate the light shielding area of the light shielding block 202, thereby avoiding errors in the calculation of the light shielding area due to a gap for light leakage which is caused by the non-overlapped positions of the light shielding bar 201 and the light shielding block 202.

On this basis, when the display area A has an irregular edge C in left-right symmetry (as illustrated in FIG. 5), in order to reduce the difference of the display effects between the left and right portions of the vision weakening area 101, the light shielding block 202 may be located in a left portions of the display area A and the light shielding block 202 may be located in a right portions of the display area A are symmetrical to each other in shape.

Figure 8:
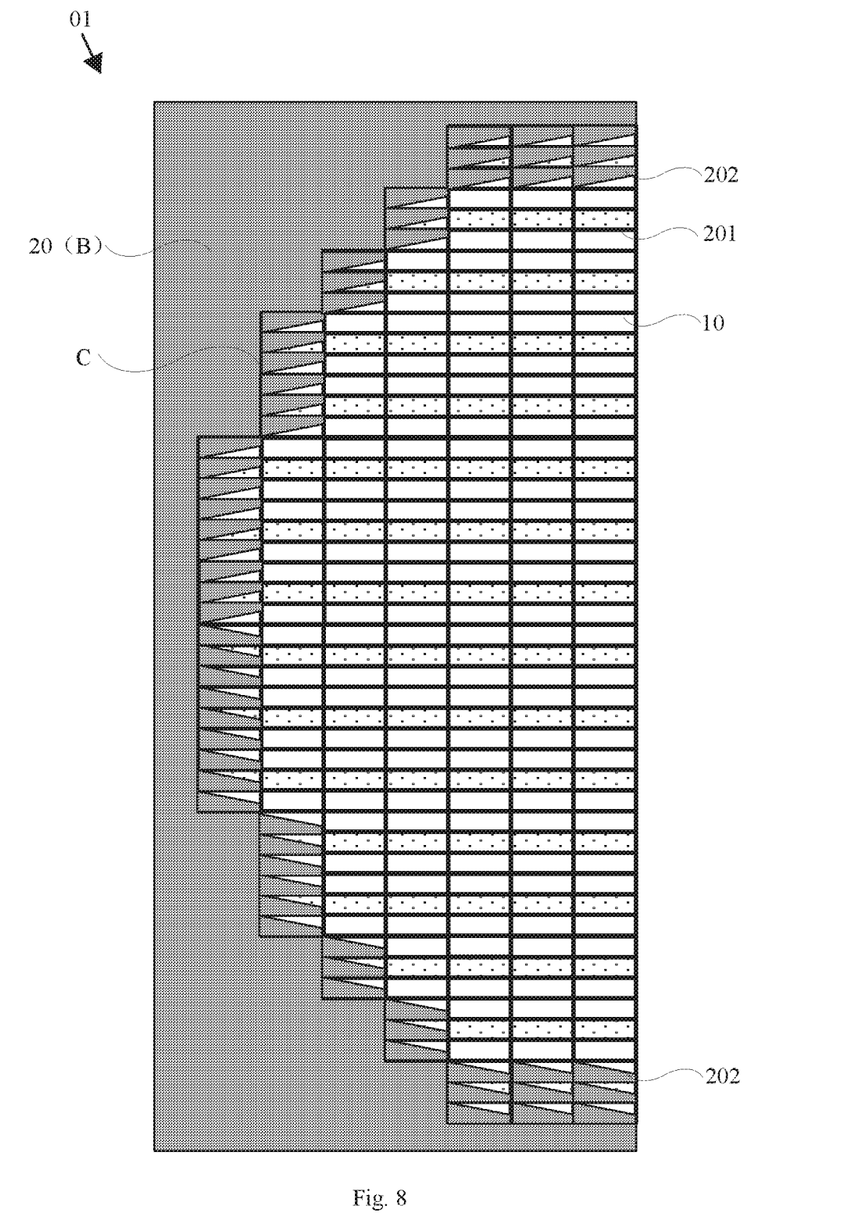
FIG. 8 illustrates a schematic diagram of a structure of a vision weakening area close to irregular edges of an AA area according to another embodiment of the present disclosure.

Alternatively, when the display area A has an irregular edge C in upper-lower symmetry (as illustrated in FIG. 8), in order to reduce the difference of the display effects between the upper and lower portions of the vision weakening area 101, the light shielding block 202 located in an upper portions of the display area A and the light shielding block 202 located in a lower portions of the display area A are symmetrical to each other in shape.

It should be noted that herein "left", "right", "upper", "lower" and other orientation terms are defined with respect to the placement direction of the display substrate illustrated in the drawings. It should be understood that these directional terms are relative concepts, which are used for relative description and clarification, and can be changed correspondingly along with the placement direction of the display substrate.

In summary, the display area A has a vision weakening area 101 close to the irregular edge C, and the vision weakening area 101 has light shielding blocks 202 disposed in the subpixels 10. Since the light shielding block 202 occupies a part of the area of the subpixel 10, the original light transmittance of the subpixel 10 can be correspondingly decreased to reduce the brightness of the subpixel 10. In this way, the brightness of the vision weakening area 101 can be reduced as a whole, so that the sensitive of human eyes in capturing images displayed around the irregular edge C is reduced when displaying, and finally the saw-toothed vision effect of the area where the irregular edge C is located can be weakened.

The arrangement of the light shielding blocks 202 in the vision weakening area 101 will be described in detail as follows.

Figure 9:
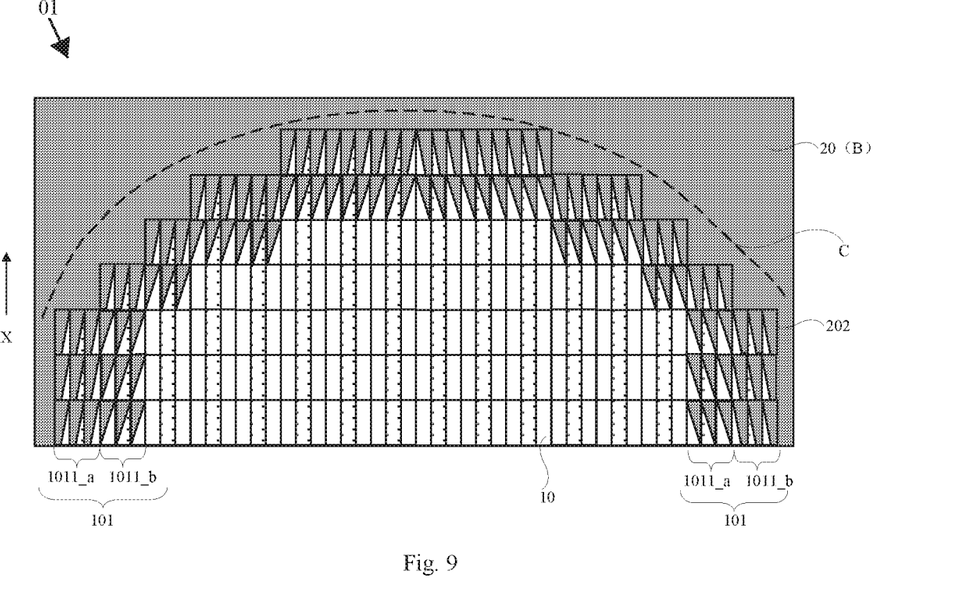
FIG. 9 illustrates a schematic diagram of a structure of a vision weakening area including two weakening sub-areas according to an embodiment of the present disclosure.
Figure 10:
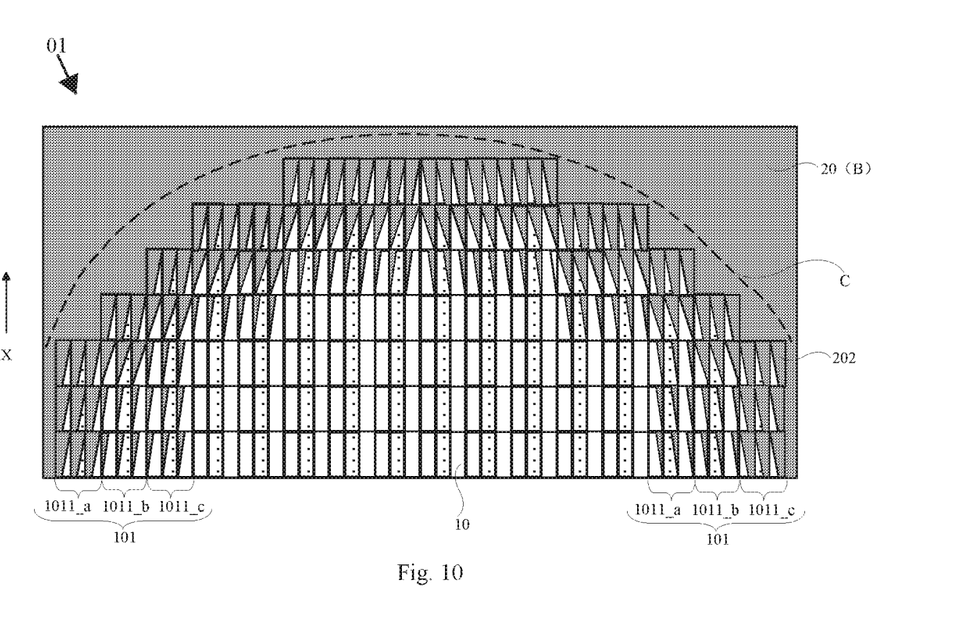
FIG. 10 illustrates a schematic diagram of a structure of a vision weakening area including three weakening sub-areas according to an embodiment of the present disclosure.

Specifically, in order to further weaken the saw-toothed vision effect of the area where the irregular edge C is located when displaying, according to an embodiment of the present disclosure, as illustrated in FIG. 9 or FIG. 10, the vision weakening area 101 includes a plurality of weakening sub-areas 1011 close to the irregular edge C. Specifically, the vision weakening area 101 in FIG. 9 includes two weakening sub-areas 1011_a and 1011_b. The vision weakening area 101 in FIG. 10 includes three weakening sub-areas 1011_a, 1011_b, and 1011_c. In this way, by dividing a plurality of weakening sub-areas 1011 in the vision weakening area 101, the vision weakening area 101 can be refined.

In which, in a same weakening sub-area 1011, the area of the light shielding block 202 in each of the subpixels 10 is equal. In that case, the area of each of the light shielding blocks 202 in the same weakening sub-area 1011 is equal, so that each of the subpixels 10 in the same weakening sub-area 1011 has a same transmittance. At that time, the value of the brightness is consistent everywhere in the same weakening sub-area 1011, so that the brightness of this weakening sub-area 1011 is uniform.

Figure 11:
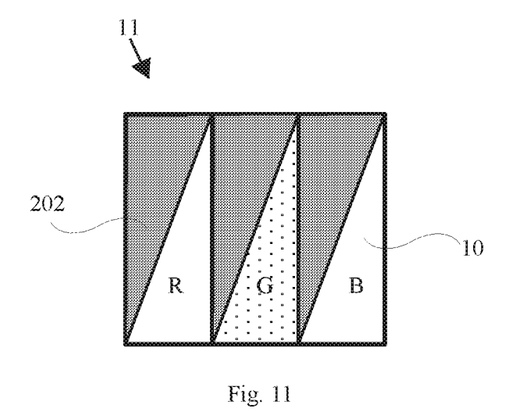
FIG. 11 illustrates a schematic diagram of a structure of a pixel unit according to an embodiment of the present disclosure.

On this basis, as illustrated in FIG. 11, a plurality of subpixels 10 adjacent to each other and having different light emitting colors constitute a pixel unit 11. For example, a red (R) subpixel 10, a green (G) subpixel 10, and a blue (G) subpixel 10 may constitute a pixel unit; alternatively, a red (R) subpixel 10, a green (G) subpixel 10, a blue (G) subpixel 10, and a white (W) subpixel 10 may constitute a pixel unit; and alternatively, a red (R) subpixel 10, a green (G) subpixel 10, a blue (G) subpixel 10, and a yellow (Y) subpixel 10 may constitute a pixel unit.

On this basis, each of the subpixels 10 in a same pixel unit 11 is located in a same weakening sub-area 1101. In that case, in the same weakening sub-area 1101, since the light shielding block 202 in each of the subpixels 10 has an equal area, the light shielding block 202 in each of the subpixels 10 in the same pixel unit 11 has the equal area. In this way, each of the subpixels 10 in the same pixel unit 11 has a same transmittance, thereby avoiding the problem that an individual color in the pixel unit 11 is too bright.

In addition, the area of the light shielding blocks 202 in the weakening sub-areas 1011 gradually increases in the arrangement direction of the weakening sub-areas 1011 toward the irregular edge C. In this way, the transmittance of the subpixel 10 in the weakening sub-areas 1011 decreases as the distance to the irregular edge C is shortened, thereby reducing the sensitive of the user's eyes in capturing images displayed around the irregular edge C. At the same time, the transmittance of the subpixel 10 in the weakening sub-areas 1011 increases as the distance to the irregular edge C is lengthened, thereby reducing the brightness difference between the subpixel 10 in the weakening sub-area 1011 close to a middle display area of the display substrate and the subpixel 10 in the middle display area, and avoiding the affect on the display effect of the middle display area.

Specifically, for example in FIG. 9, the area of the light shielding block 202 in the weakening sub-area 1011_b away from the irregular edge C is smaller than the area of the light shielding block 202 in the weakening sub-area 1011_a close to the irregular edge C.

Alternatively, for example in FIG. 10, the area of the light shielding block 202 in the weakening sub-area 1011_c farthest from the irregular edge C is the minimum, the area of the light shielding block 202 in the weakening sub-area 1011_b second farthest from the irregular edge C is larger than the area of the light shielding block 202 in the weakening sub-area 1011_c, while the area of the light shielding block 202 in the weakening sub-area 1011_a close to the irregular edge C is the maximum.

In which, the vision weakening area 101 including three weakening sub-areas 1011_a, 1011_b, and 1011_c which are sequentially away from the irregular edge C is taken as an example to describe the area changes of the light shielding blocks 202 in the three weakening sub-areas 1011_a, 1011_b, and 1011_c.

Figure 12:
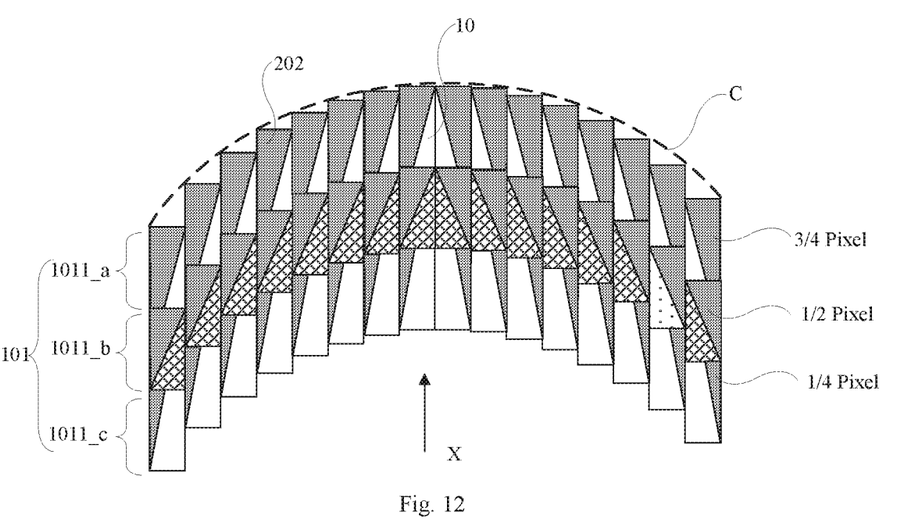
FIG. 12 illustrates an enlarged view of a partial structure of FIG. 10.

Specifically, as illustrated in FIG. 12, since the area of the light shielding block 202 in the weakening sub-areas 1011 gradually increases in the arrangement direction X of the weakening sub-areas 1011 toward the irregular edge C, the area of the light shielding block 202 in the weakening sub-area 1011_c farthest from the irregular edge C may be ¼ of the original area of the rectangular subpixel 10 (Pixel), the area of the light shielding block 202 in the weakening sub-area 1011_b second farthest from the irregular edge C may be ½ of the original area of the rectangular subpixel 10 (Pixel), while the area of the light shielding block 202 in the weakening sub-area 1011_a close to the irregular edge C is the maximum, which may be ¾ of the original area of the rectangular subpixel 10 (Pixel).

As can be seen from the above description, in the arrangement direction X of the weakening sub-areas 1011 toward the irregular edge C, the absolute values of the differences between the areas of the light shielding blocks 202 in any adjacent two of the weakening sub-areas, such as 1011_c and 1011_b, or 1011_b and 1011_a, are the same, both being ¼ of the area of the pixel. Thus, in the arrangement direction X of the weakening sub-areas 1011 toward the irregular edge C, the values of the areas of the light shielding blocks 202 in those weakening sub-areas 1011 are in an arithmetic progression.

In this way, in the vision weakening area 101, the brightness of the subpixels 10 may be reduced step by step in the direction X toward the irregular edge C to reduce the brightness difference between adjacent weakening sub-areas 1011, so that the brightness of a plurality of weakening sub-areas 1011 arranged in sequence can be smoothly transited, thereby further weakening the saw-toothed vision effect of the area where the irregular edge C is located when displaying.

Of course, the above just describes the area changes of the light shielding blocks 202 in each of the weakening sub-areas 1011 by taking the vision weakening area 101 including three weakening sub-areas 1011_a, 1011_b, and 1011_c which are sequentially away from the irregular edge C as an example. Those skilled in the art will understand that the vision weakening area 101 may further include any other number of weakening sub-areas 1011. Generally, the area of the vision weakening area 101 can be defined without affecting the display effect of the middle area of the display substrate. In that case, the absolute value of the difference between the areas of the light shielding blocks 202 in any adjacent two of the weakening sub-areas 1011 decreases as the number of the weakening sub-areas 1011 included in the vision weakening area 101 increases, so that the weakening of the saw-toothed vision effect is more ideal.

On this basis, each of the weakening sub-areas 1011 includes N rows and/or N columns of the subpixels 10, wherein N≥1, and N is a positive integer. For example in FIG. 10, each of the weakening sub-areas 1011_a, 1011_b, and 1011_c includes one row of the subpixels 10 in a horizontal direction and three columns of the subpixels 10 in a vertical direction. In this way, in the vision weakened area 101, the numbers of the subpixels 10 in any adjacent two of the weakening sub-areas 1011 can be equal or approximately equal. Therefore, it is convenient for persons skilled in the art to calculate the areas of the light shielding blocks 202 in each of the weakening sub-areas 1011 according to the brightness gradual change rule of the plurality of weakening sub-areas 1011.

Figure 13:
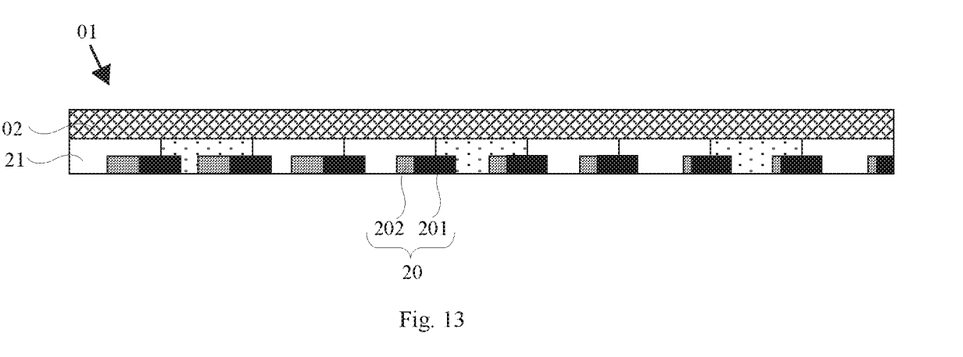
FIG. 13 illustrates a cross-sectional view of a structure of a display substrate according to an embodiment of the present disclosure.

In addition, the display substrate 01 may be a color film substrate. In that case, as illustrated in FIG. 13, the display substrate 01 further includes a substrate 02 and a color filter layer 21 located thereon. On this basis, the black matrix 20 is disposed on a side of the color filter layer 21 away from the substrate 02.

Alternatively, the display substrate 01 may be an array substrate. In that case, the display substrate 01 further includes a substrate and a Thin Film Transistor (TFT) array structure located thereon.

In which, the TFT array structure is located in the display area A of the display substrate 01. Specifically, the TFT array structure may include a TFT array located on the substrate, and a passivation layer, a pixel electrode, etc. located on a side of the TFT array away from the substrate.

In that case, the black matrix 20 may be disposed on a side of the TFT array structure away from the substrate. At that time, the TFT array structure is located between the black matrix 20 and the substrate.

In addition, when the display substrate 01 is an array substrate, the color filter layer 21 may also be integrated on the array substrate.

An embodiment of the present disclosure provides a display device, including any display substrate 01 described above. The beneficial effects of the display device are the same as those of the display substrate provided in the previous embodiments, and are omitted herein. In addition, the structure of the display substrate 01 has been described in the previous embodiments and is omitted herein.

It should be noted that in the embodiments of the present disclosure, the display device specifically may be any product or component with a display function, such as a liquid crystal display, a liquid crystal television, a digital photo frame, a mobile phone, or a tablet computer.

On this basis, as illustrated in FIG. 3, the display substrate 01 further includes a non-display area B located around the display area A.

In that case, the display device may further include a component to be integrated (not illustrated in the drawings). The orthographic projection of the component to be integrated on the display substrate 01 is located in the recessed portion of the irregular edge C of the display area A. In this way, the AA area can surround a part of the component to be integrated, thereby reducing the area of the non-display area B occupied by the component to be integrated, and promoting the design of the narrow frame and the wide screen.

In which, the component to be integrated may be an earpiece, a camera, or a touch structure.

Those described above are just specific embodiments of the present disclosure, and the protection scope of the present disclosure is not limited thereto. Any variation or substitution easily conceivable for persons skilled in the art within the technical scope revealed by the present disclosure shall fall within the protection scope of the present disclosure. Therefore, the protection scope of the present disclosure shall be determined by the appended claims.

What is claimed is:

1. A display substrate including a black matrix, wherein the display substrate is provided with a display area, and at least a part of an edge of the display area has an irregular edge having a concave-convex shape;
    wherein the display area has a plurality of subpixels arranged in a matrix form;
    wherein the display area has a vision weakening area close to the irregular edge, and in the vision weakening area, the black matrix includes a light shielding block located in the subpixel;
    wherein the vision weakening area includes a plurality of weakening sub-areas close to the irregular edge;

wherein in a same weakening sub-area, areas of the light shielding block in each of the subpixels are equal;

wherein in an arrangement direction of the weakening sub-areas toward the irregular edge, an area of the light shielding block in each of the plurality of weakening sub-areas gradually increases; and wherein each of the plurality of weakening sub-areas includes N rows and/or N columns of the subpixels, wherein N≥1, and wherein N is a positive integer.

2. The display substrate according to claim 1, wherein in the arrangement direction of the weakening sub-areas toward the irregular edge, absolute values of differences between the areas of the light shielding blocks in adjacent two of the weakening sub-areas are equal.

3. The display substrate according to claim 1, wherein a plurality of subpixels adjacent to each other and having different light emitting colors constitute one pixel unit, and each of the subpixels in a same pixel unit is located in a same weakening sub-area.

4. The display substrate according to claim 1, wherein a shape of the light shielding block is rectangular, and in each of the subpixels, the light shielding block is disposed close to the irregular edge.

5. The display substrate according to claim 1, wherein a shape of the light shielding block is non-rectangular, and in each of the subpixels, an area of the light shielding block gradually increases in a direction toward the irregular edge.

6. The display substrate according to claim 5, wherein a shape of the light shielding block is a right-angled triangle, and wherein one of a bottom edge and a right-angled edge of the right-angled triangle is close to the irregular edge.

7. The display substrate according to claim 5, wherein a shape of the light shielding block is a right-angled trapezoid, and wherein one of a bottom edge and a right-angled edge of the right-angled trapezoid is close to the irregular edge.

8. The display substrate according to claim 1, wherein the display area has an irregular edge in left-right symmetry, and wherein the light shielding block located in a left half of the display area and the light shielding block located in a right half of the display area are symmetrical to each other in shape.

9. The display substrate according to claim 1, wherein the display area has an irregular edge in upper-lower symmetry, and wherein the light shielding block located in an upper half of the display area and the light shielding block located in a lower half of the display area are symmetrical to each other in shape.

10. The display substrate according to claim 1, further including a substrate and a color filter layer located thereon, and wherein the black matrix is disposed on a side of the color filter layer away from the substrate.

11. The display substrate according to claim 1, further including a substrate and a TFT array structure disposed between the substrate and the black matrix, wherein the TFT array structure is located in the display area of the display substrate.

12. A display device including the display substrate according to claim 1.

13. The display device according to claim 12, wherein the display substrate further includes a non-display area located around the display area;

wherein the display device further includes a component to be integrated, and wherein an orthographic projection of the component to be integrated on the display substrate is located in a recessed portion of the irregular edge of the display area.

* * * * *